(12) United States Patent
Tarvainen et al.

(10) Patent No.: US 7,173,434 B2
(45) Date of Patent: Feb. 6, 2007

(54) METHOD FOR DETERMINING THE RF SHIELDING EFFECTIVENESS OF A SHIELDING STRUCTURE

(75) Inventors: Timo Tarvainen, Oulu (FI); Juha Seppala, Oulu (FI); Jari Kolehmainen, Oulu (FI); Arto Auno, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/320,911

(22) Filed: Dec. 30, 2005

(65) Prior Publication Data

US 2006/0170430 A1    Aug. 3, 2006

(30) Foreign Application Priority Data

Dec. 31, 2004    (GB)    .................... 0428560.7

(51) Int. Cl.
G01R 27/28    (2006.01)

(52) U.S. Cl. ........................ 324/627; 324/612

(58) Field of Classification Search ................ 324/627; 326/612
See application file for complete search history.

(56) References Cited

U.S. PATENT DOCUMENTS 6,686,748 B2 *    2/2004    Reiser et al. ............... 324/627

* cited by examiner

*Primary Examiner*—Walter Benson
(74) *Attorney, Agent, or Firm*—Squire, Sanders & Dempsey, L.L.P.

(57) ABSTRACT

Determining the RF shielding effectiveness of a shielding structure including measuring RF isolation between a first and a second element of a directional coupler and providing a first measurement result, placing a shielding structure so that a part of the shielding structure is substantially between the first element and the second element of the directional coupler, measuring RF isolation between the first element and the second element of the directional coupler RF and providing a second measurement result, and determining the shielding effectiveness of the shielding structure based at least in part on the first and the second measurement result.

6 Claims, 1 Drawing Sheet

METHOD FOR DETERMINING THE RF SHIELDING EFFECTIVENESS OF A SHIELDING STRUCTURE

FIELD OF THE INVENTION

This invention relates to electromagnetic shielding in radio frequency applications, specifically to determining RF shielding effectiveness of shielding structures.

TECHNOLOGICAL BACKGROUND

Conventional measurement methods for determining RF shielding effectiveness of a shielding structure typically use antennas, loops, radiating pins, transfer impedance, external signals, and various plate structures to determine the shielding effectiveness. Each of these have one or more of the following problems especially when determining the shielding effectiveness of a structure such as an RF shielding enclosure module with an RF gasket: (i) lack of the desired characteristic of module mechanics and gasket together, (ii) excessive size for module level, (iii) limited frequency range, (iv) limited dynamic range, (v) the probe can't be measured without mechanics, (vi) reliability of contacts that are part of the test set-up, but not a part of the measured system, (vii) isolation can be measured only to external world and not between two compartments.

A prior art document which deals with determination of shielding effectiveness is the patent U.S. Pat. No. 4,789,829, which describes a method which is based on current sensing between two electrodes. However, this method is not applicable to measuring the shielding effectiveness of a shielding enclosure module and an RF gasket together.

Another prior art document which deals with determination of shielding effectiveness is the patent DE19920986, which describes a shielding quality assessment method based on comparison of LF or MF broadcast signal field strength within and outside a screened area. This method has the drawback that it only characterizes isolation to the external world, and is suitable only for large spaces such as rooms and buildings.

An article which describes the state of the art in teseting of electromagnetic shielding is "Microwave Testing of Electromagnetic Shielding on Printed Wiring Boards", by M. Vahtola and T. Tarvainen, in International Conference on Advanced Applications in Electromagnetics—ICEAA01, 2001, pp. 339–342. This article describes a method using isolation measurement between two short circuited pins.

A further illustrative article is "Effect of apertures in multiple EMI enclosures on RF printed circuit boards" by Clupper T., in IEEE EMC International Symposium, Aug. 13–17, 2001, Montreal, Canada, pp. 276–277. This article describes a method using isolation measurement between two loops. This method has the disadvantage that the dynamic range of the measurement is limited.

SUMMARY OF THE INVENTION

Embodiments of the present invention aim to overcome one or several of the above problems.

According to one aspect of the invention, a method for determining the RF shielding effectiveness of a shielding structure is provided. The method comprises the steps of
measuring RF isolation between a first and a second element of a directional coupler, thereby providing a first measurement result,
placing a shielding structure so that a part of the structure is substantially between the first and the second element of the directional coupler,
measuring RF isolation between the first and the second element of the directional coupler, thereby providing a second measurement result, and
determining the shielding effectiveness of the shielding structure at least in part on the basis of the first and the second measurement result.

The structure may comprise an RF enclosure with two compartments. The structure may also comprise an RF gasket.

According to another aspect of the invention, an apparatus for determining the RF shielding effectiveness of a structure is provided. The apparatus comprises
a directional coupler,
means for placing a shielding structure so that at least a part of the shielding structure is substantially between a first and a second element of the directional coupler,
means for determining RF isolation between the first and the second element of the directional coupler,
means for determining the RF shielding effectiveness at least in part on the basis of a first and a second measurement result of the RF isolation.

BRIEF DESCRIPTION OF THE DRAWINGS

Embodiments of the present invention will now be described by way of example with reference to the accompanying drawings, in which.

DETAILED DESCRIPTION OF EMBODIMENTS

Figure 1:
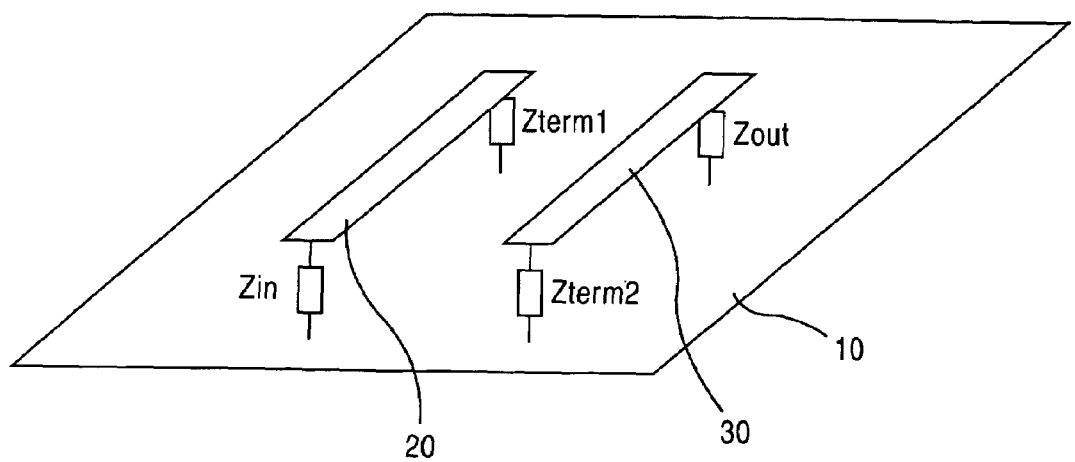
FIG. 1 illustrates a directional coupler on a ground plane.

FIG. 1 illustrates a directional coupler on a ground plane 10. The directional coupler comprises two elements 20, 30.

According to the inventive method, the RF isolation is measured first for a directional coupler without the shielding structure to provide a first measurement result, e.g. in a situation illustrated by FIG. 1. Preferably, the directional coupler has a wide operational frequency band covering the frequency band the shielding structure will be used with.

Figure 2:
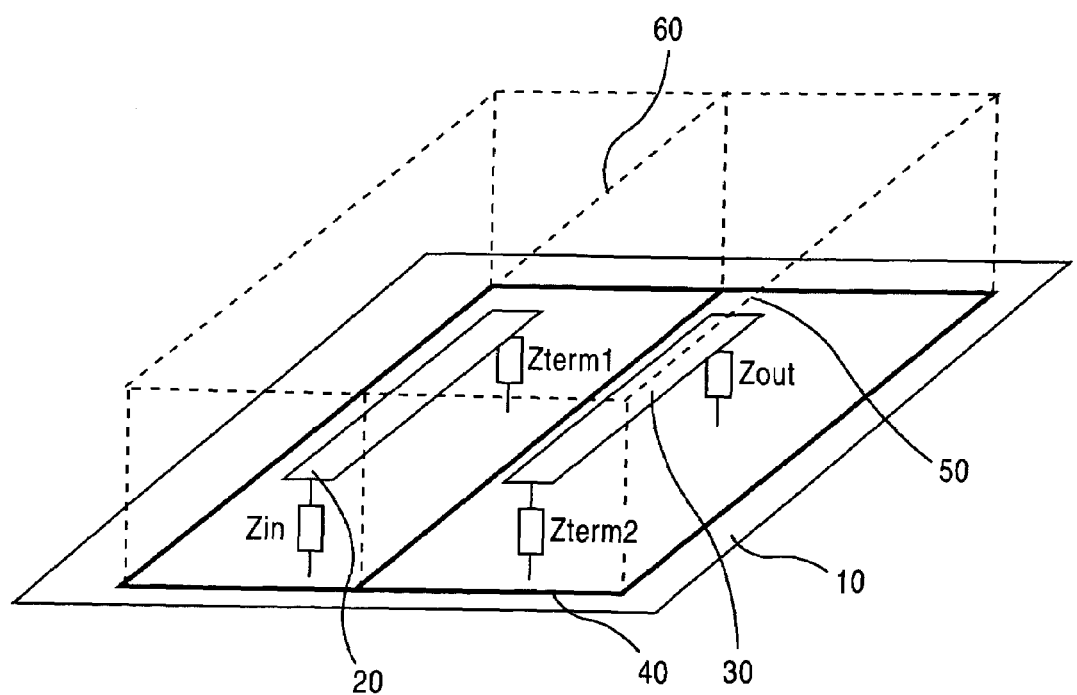
FIG. 2 illustrates a shielding structure in place for measurement of the shielding effectiveness of the shielding structure by use of the directional coupler.

Next, the shielding structure is placed so that at least a part of the shielding structure is substantially between the two elements 20, 30 of the directional coupler. This placement is illustrated in FIG. 2, which illustrates a shielding structure comprising a shielding enclosure module 50 and an RF gasket 40. In the example of FIG. 2, the shielding structure comprises two compartments separated by a wall 60. The wall 60 and the corresponding portion of the RF gasket 40 are positioned between the two elements 20, 30 of the directional coupler so that the two elements 20, 30 are in separate compartments.

Next, the RF isolation between the elements of the directional coupler is measured again to provide a second measurement result. The shielding efficiency of the shielding structure can then be determined from the first and the second measurement results. For example, a result representing the shielding efficiency can be obtained by subtracting the first measurement result from the second measurement result.

The first measurement providing the first measurement result without the shielding structure and the second measurement providing the second measurement result with the shielding structure can be widely separated in time. For example, in an embodiment in which the inventive method is used in production of radio equipment, the first measurement without the shielding structure can be performed during calibration and testing of the testing equipment, and the second measurement during production activities in the production line serially for a plurality of shielding structures.

The inventive method can be used for example in a production line for performing quality testing for shielding structures. The inventive method can also be used in development of new shielding structures. The inventive method can also be used for determination of shielding effectiveness of parts of structures, such as RF gaskets.

The invention has several advantages. The method allows testing of shielding effectiveness in a wide frequency band, and the use of a directional coupler provides a substantially flat frequency response in a wide frequency band. The testing method can be implemented in many different types of environments. The present invention allows measuring shielding effectiveness of an RF structure in an environment that very closely simulates real assembly on a module level environment.

It is also noted herein that while the above describes exemplifying embodiments of the invention, there are several variations and modifications which may be made to the disclosed solution without departing from the scope of the present invention as defined in the appended claims.

The invention claimed is:

1. Method for determining the RF shielding effectiveness of a shielding structure, the method comprising:
   measuring RF isolation between a first element and a second element of a directional coupler and providing a first measurement result;
   placing a shielding structure so that a part of the shielding structure is substantially between the first element and the second element of the directional coupler;
   measuring RF isolation between the first element and the second element of the directional coupler and providing a second measurement result; and
   determining the RF shielding effectiveness of the shielding structure based at least in part on the first and the second measurement result.

2. A method according to claim 1, wherein the shielding structure comprises an RF enclosure with two compartments.

3. A method according to claim 1, wherein the shielding structure comprises an RF gasket.

4. Apparatus for determining the RF shielding effectiveness of a structure, the apparatus comprising;
   a directional coupler;
   means for determining RF isolation between a first element and a second element of the directional coupler and providing a first measurement result;
   means for placing a shielding structure so that at least a part of the shielding structure is substantially between the first element and the second element of the directional coupler;
   means for determining RF isolation between the first element and the second element of the directional coupler and providing a second measurement result; and
   means for determining the RF shielding effectiveness based at least in part on the first and the second measurement result of the RF isolation.

5. A device for determining the RF shielding effectiveness of a shielding structure, the device comprising:
   a first measuring module that measures RF isolation between a first element and a second element of a directional coupler and providing a first measurement result;
   a holder that receives a shielding structure so that a part of the shielding structure is substantially between the first element and the second element of the directional coupler;
   a second measuring module that measures RF isolation between the first element and the second element of the directional coupler and providing a second measurement result; and
   a determination module that determines the RF shielding effectiveness of the shielding structure based at least in part on the first and the second measurement result.

6. A device for determining the RF shielding effectiveness of a shielding structure, the device comprising:
   a first measuring unit configured to measure RF isolation between a first element and a second element of a directional coupler and providing a first measurement result;
   a holder that receives a shielding structure so that a part of the shielding structure is substantially between the first element and the second element of the directional coupler;
   a second measuring unit configured to measure RF isolation between the first element and the second element of the directional coupler and providing a second measurement result; and
   a determination unit configured to determine the RF shielding effectiveness of the shielding structure based at least in part on the first and the second measurement result.

* * * * *